United States Patent [19]

Scheutzow

[11] Patent Number: 5,396,186
[45] Date of Patent: Mar. 7, 1995

[54] VACUUM ACTUATED MULTIPLE LEVEL PRINTED CIRCUIT BOARD TEST FIXTURE

[75] Inventor: Mark P. Scheutzow, Winter Springs, Fla.

[73] Assignee: Landers Plastics Inc., Pompano Beach, Fla.

[21] Appl. No.: 103,112

[22] Filed: Aug. 9, 1993

[51] Int. Cl.$^6$ .............................................. G01R 15/12
[52] U.S. Cl. ...................................... 324/754; 324/755
[58] Field of Search ...................... 324/158 F, 158 P; 439/482

[56] References Cited

U.S. PATENT DOCUMENTS

| | | | |
|---|---|---|---|
| 4,814,698 | 3/1989 | St. Onge | 324/158 |
| 5,214,374 | 5/1993 | Onge | 324/158 F |

*Primary Examiner*—Kenneth A. Wieder
*Assistant Examiner*—Mark Wardas
*Attorney, Agent, or Firm*—Alvin S. Blum

[57] ABSTRACT

A printed circuit board to be tested on a test fixture mounts sealingly on a movable top plate having through holes located directly beneath test points on the board. A base plate below the top plate is provided with a plurality of upstanding, spring-loaded test probes arranged to pass through the holes in the top plate when the two plates are drawn together by a vacuum established in the space between the plates. A resilient gasket seals the perimeter of the plates defining the vacuum chamber between the plates. The plates are held resiliently apart by compression springs. A vacuum source is connected to the vacuum chamber by a vacuum control. The test probes are of two different heights. When a full vacuum is applied to the vacuum chamber, the plates are pulled close together and all test probes contact test points on the circuit board in a first test mode of operation. The vacuum control includes a sensor of the distance between plates and admits enough vacuum to maintain a preset interplate distance for a second test mode, wherein the plates are spaced apart sufficiently to enable a first population of test probes to contact test points on the circuit board while a second, shorter population of test probes remain spaced apart from the circuit board. An atmospheric venting valve with feedback control facilitates moving from one test mode to another. In another embodiment additional levels or test modes are provided.

4 Claims, 2 Drawing Sheets

VACUUM ACTUATED MULTIPLE LEVEL PRINTED CIRCUIT BOARD TEST FIXTURE

BACKGROUND OF THE INVENTION

The present invention relates to a test fixture for use in automatic test equipment for electronically checking a printed circuit board (PCB) and more particularly for such a fixture which is provided with means for contacting a first set of contact points on the board with a first set of test probes and for contacting additional points with additional probes in at least one additional operating mode using a vacuum actuated feedback mechanism.

Automatic electronic test equipment for checking printed circuit boards are well known. Hundreds of test points on the circuit board must be selectively tested. This is generally accomplished with a vacuum actuated test fixture employing a first plate with an array of upstanding, spring-mounted test probes. The probes are positioned to engage the test points on the board. The board is mounted on a second plate parallel to the first plate with holes arranged to pass the probes therethrough. Springs hold the plates apart until a vacuum between the plates pulls them together, whereupon the probes contact the test points.

For certain testing applications, it is desirable to have two or more testing modes in which only selected ones of the probes are in contact with their test points while other probes are spaced away from their test points. Prior art test fixtures have employed spring-mounted test probes having two different lengths. These have regulated the spacing apart of the plates by means of a pressure regulator for maintaining a preset partial vacuum great enough to force the plates close enough for only the long probes to make contact in a first level test mode and applying full vacuum to force the plates so close together that all the probes make contact in a second level test mode.

Fixtures using the vacuum regulator to control board position relative to the test probes rely upon the principle that a given vacuum will result in a given atmospheric pressure forcing the plates together against the springs in the vacuum chamber. This system controls only the vacuum, not the distance between plates directly. It has been found in practice that any change in atmospheric pressure, spring tension, and leaks at the various gaskets or through the circuit board results in fluctuations in the partial travel position at a preset pressure on the regulator, resulting in inconsistent performance and requiring individual adjustment of the regulator for each board in some cases.

SUMMARY OF THE INVENTION

It is, accordingly, an object of the present invention to provide a vacuum actuated printed circuit board test fixture with at least two modes of operation in which all of the test probes make contact with test points on the board in a first mode of operation and certain selected ones of those test probes are spaced apart from their test points in another one or more modes of operation.

It is another object that these modes of operation are provided by means of a vacuum control valve cooperating with a preset position sensor which senses the spacing between plates thereby providing a feedback mechanism to maintain one or more preset spacings independent of variations in the vacuum source, leakage, spring tension and other variables.

It is yet another object to provide a fixture which permits rapid changing between plate spacings or modes or levels once the initial vacuum has been applied.

It is yet another object to provide the maintaining of a given level or the changing between levels using a minimum of power consumption.

It is yet another object to provide automatic atmospheric venting of the vacuum chamber for speeding the change between levels as required.

The test fixture of the invention comprises a base plate with a first set of short test probes and a second set of longer test probes resiliently mounted on, and extending upward from, the base plate. A second plate is held parallel above the base plate by springs. Resilient perimeter gasket between the plates defines a vacuum chamber. Holes in the second plate are located so as to permit the test probes to pass through the second plate when a vacuum applied to the vacuum chamber draws the plates together. The printed circuit board is sealingly mounted above the second plate so that the test probes passing through the second plate will contact test points on the board for testing.

A vacuum source is connected to the vacuum chamber by a vacuum control valve. Stop elements between the plates maintain a fixed first distance between the plates when the control valve is fully opened and the full vacuum is applied to the vacuum chamber. All of the test probes contact their test points on the board in this first mode of operation. An adjustable position sensor senses the spacing between plates. In a second, or mid-level, mode of operation, the sensor cooperates with the vacuum control valve in a feedback mechanism to apply just enough vacuum to maintain the spacing between plates at a preset distance which permits the longer test probes to contact their test points but keeps the shorter test probes spaced apart from their test points. Because the control is regulated by the spacing between plates, i.e. feedback, the fixture can precisely and reproducibly maintain this spacing from board to board despite variations in leakage, vacuum source and the like. All circuit board test fixtures experience intrinsic leakage. Intrinsic leakage is variable. Several cubic feet per minute of atmosphere leakage must be tolerated in practice. Sources of leakage include gaskets, test probe supports, open VIA holes and unsealed hardware on boards. It may be equivalent to a one mm hole in the top plate and will usually leak enough to allow complete release of the fixture from full travel in 3-5 seconds.

These and other object, advantages and features of the invention will become more apparent when the detailed description is studied in conjunction with the drawings.

DETAILED DESCRIPTION OF PREFERRED EMBODIMENTS

Figure 1:
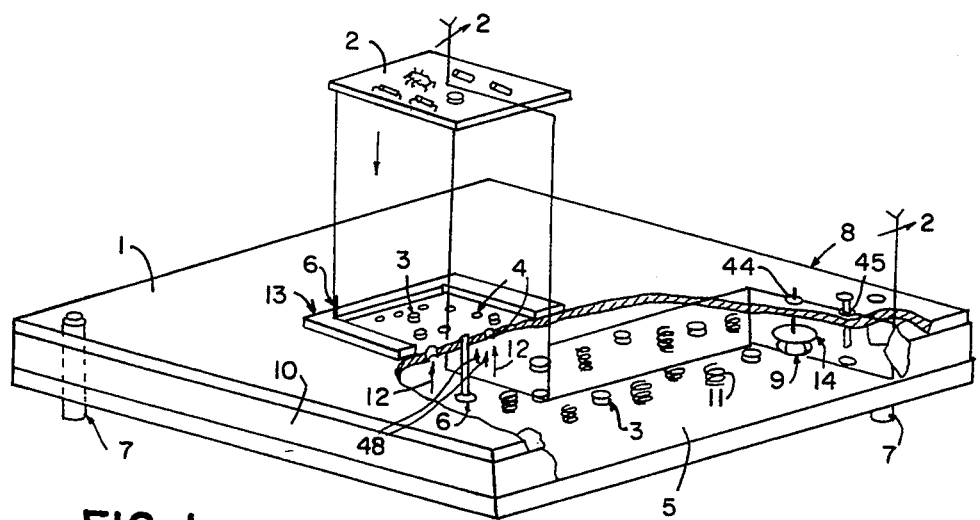
FIG. 1 is a perspective view, partially cut away, of an embodiment of the invention, with test board unmounted and cabinetry and solenoid valve omitted for clarity.
Figure 2:
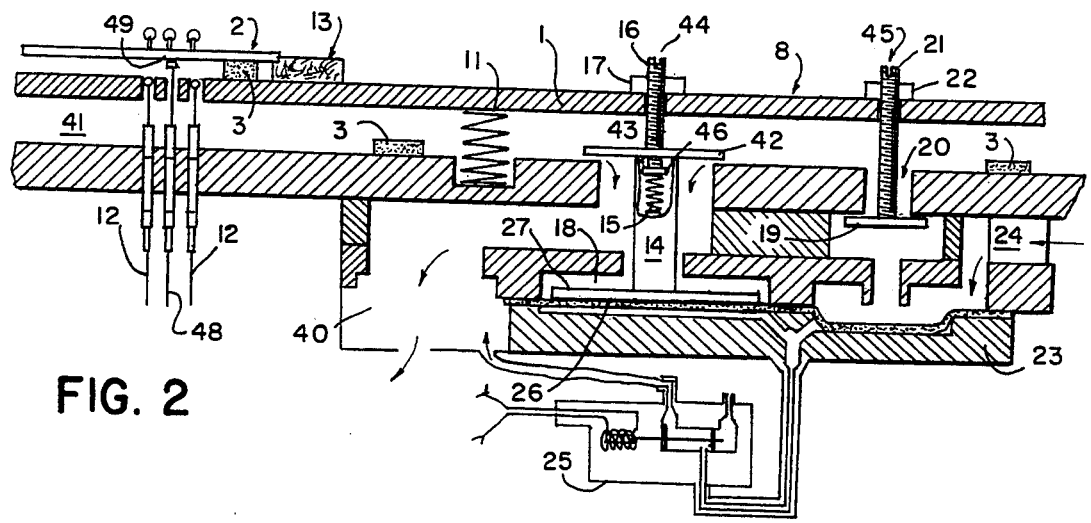
FIG. 2 is a partial sectional view, taken through line 2—2 of FIG. 1 with test board mounted and fixture in partially closed mode of operation.

Referring now first to FIGS. 1 and 2, an upper plate 1 of rigid non-conductive material, carrying a gasket 13 to sealingly mount, and hold by vacuum, the printed circuit board (PCB) 2 for testing.

Also, sufficient pads (stops) 3 support the PCB while vacuum is applied. This plate 1 will have clearance holes 4 corresponding to the spring contact test probe 12 locations in the lower plate 5 (made of similar but thicker material as the upper plate). Lateral alignment of plates/printed circuit board is achieved by a minimum of two tooling pins 6, and two diagonally opposed guide pins 7. Sufficient pads (stops) 3 distributed over the top surface of the low, or base, plate 5 prevent contact of plate 1 and plate 5 when in the full travel position with full vacuum applied, maintaining a path for air to be drawn out through position control valve assembly 8 through port 9 by vacuum source 40.

Compressible gasket seal 10 closes off the perimeter of the plates, thereby defining a vacuum chamber 41 between the plates. Counterforce springs 11 prevent the upper plate 1 from being pushed down by atmospheric pressure ahead of the printed circuit board 2 (this would result in a failure to actuate due to spring contact probe 12 force lifting the printed board 2 off the gasket 13). Also, distribution of the counterforce springs 11 can be used to balance an off center printed circuit board 2 location when required for level actuation.

FIG. 2 shows upper plate 1 in the partial travel position in which tall probe 48 contacts a test point 49 on PCB 2 and short probes 12 are spaced away from the PCB.

Position control valve assembly 8 has two main sections, a position control sensor and valve section 44 and a "speed" or fast vent section 45. Section 44 comprises valve unit 14 which has a broad thin head 42 which opens and closes the port 9 in base plate 5 to control vacuum applied to vacuum chamber 41. A barrel 43 closed at the bottom contains a compression spring 15 which bears against internal shoulder 46 on plunger 16. This plunger is slotted, etc., to allow adjustment of the partial travel position and is threaded into the upper plate. Jam nut 17 locks plunger 16 in place and thus mounts valve unit 14 in the upper plate 1. The bottom of the valve unit 14 protrudes into the diaphragm well 18 when the valve is nearly seated, as shown with vacuum applied below diaphragm 26.

Section 45, the atmospheric venting means for fast level change from a close interplate spacing to a wider spacing includes valve disk 19, which is held up against port 20 by atmospheric pressure during the partial travel position, but is unseated by screw 21 during full travel. Screw 21, which is not attached to disc 19, is adjusted so that disc 19 will be allowed to seat when the top plate is in partial travel position and screw 21 is locked in place with jam nut 22. This flow path is in series with atmosphere access diaphragm valve 23 and filter 24. The purpose of section 45 is to provide quick action when changing levels from full travel to partial travel by providing an atmospheric vent that closes suddenly when partial travel position is achieved.

A tiny solenoid operated valve 25 communicates the lower side of both diaphragms 25 and 26 simultaneously to either source vacuum or atmosphere to control level selection. This small valve is the only power requiring device. When source vacuum is valved to the lower side of both diaphragms, section 44 diaphragm 26 has equal pressure on top and bottom and remains at rest, exerting no force on the lower end of valve unit 14. The fixture is normally pulled to full travel position first when initial source vacuum is applied at the beginning of test, but for purposes of explanation, assume this has already happened and the fixture has been switched from full travel (FIG. 3) to partial travel (FIG. 2). Valve unit 14 is freed to drop down and seal off the vacuum source 40 from the chamber 41. At the same time, atmospheric pressure has opened the diaphragm valve 23, allowing the speed valve 45 to admit air past valve disk 19 into chamber 41 through port 20. As top plate 1 rises, screw 21 allows valve disk 19 to seat just prior to valve unit 14 beginning to unseat. As intrinsic leakage allows the upper plate 1 to continue rising from the face of springs 11, it begins to unseat valve unit 14, opening the source vacuum port to the vacuum chamber between the plates. When the flow past the valve unit 14 equals the intrinsic leakage, upward movement stops. The position is closely maintained because the wide flat valve head 42 allows a big change in flow with only a few thousandths of an inch change in opening.

The term feedback configuration may be appropriately applied to the mechanism for maintaining the partial travel position, since the vacuum source is controllably applied to chamber 41 by the sensor and valve mechanism 44 which senses the distance between plates. When it is too short, it reduces the vacuum and when it is too great it increases the vacuum. This spacing information is fed back to the vacuum control.

Figure 3:
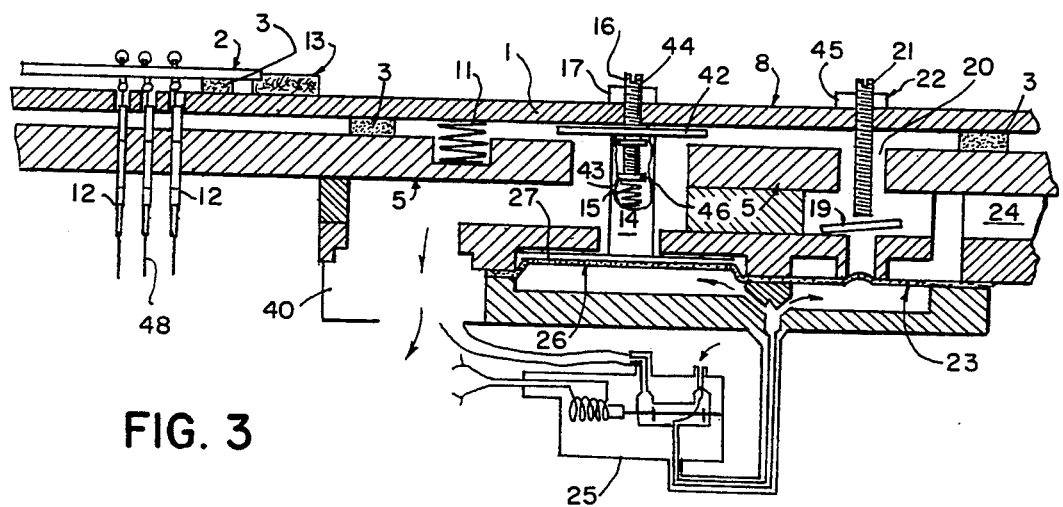
FIG. 3 is a partial sectional view, taken through line 2—2 of FIG. 1 with test board mounted and fixture in fully closed mode of operation.

Referring to FIG. 3: Solenoid valve 25 communicates atmospheric pressure to bottom of diaphragms, atmosphere access valve 23 relaxes, and diaphragm closes port to speed valve. Section 44 diaphragm 26 is pressed up by atmospheric pressure, bearing load plate 27 upward against barrel 43 of valve unit 14, unseating it wide open, causing the fixture to move to the full travel position. Solenoid valve 25 would normally be configured to provide this position when no current is applied. Additional levels can be added by the methods illustrated in FIGS. 4 and 5 in which a three level embodiment of the invention is shown.

Figure 4:
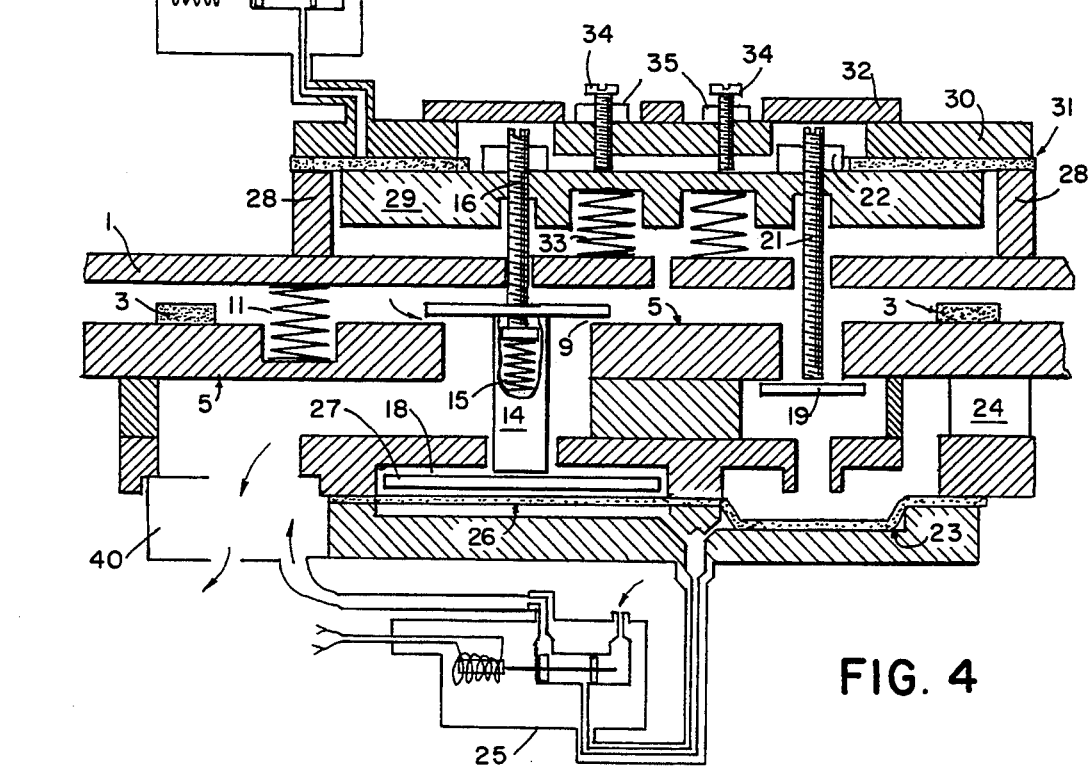
FIG. 4 is a partial sectional view, as in FIG. 3, of another embodiment of the invention having three levels or modes of operation shown in mid-level mode of operation.

Referring to FIG. 4: Fixture top plate 1 and below is basically the same in form and function as in FIGS. 2 and 3, except that plunger 16 and screw 21 thread into plate 29 instead of top plate 1 through which they have a sliding fit. Plate 29 is lifted by springs 33 of sufficient force to hold it up against adjustment screws 34. Housing 28 is high enough relative to the thickness of plate 29 to allow sufficient travel and adjustment between 2nd and 3rd level positions. A second solenoid operated control valve 36 is used, mounted where convenient and plumbed with flexible tubing if necessary, leading to the top side of diaphragm 31 through cover 30, which also holds adjustment screws 34 and jam nuts 35 for 2nd level adjustment. Removable cover 32 seals off access ports for 3rd level adjustment screws and jam nuts 16, 17, 21, and 22.

Explanation of operation: With both solenoids 25 and 36 energized, lower assembly senses and regulates position as in FIG. 2. Simultaneously springs 33 and a pressure differential somewhat higher under diaphragm 31 holds plate 29 firmly up against adjustment screws 34 bringing fixture to 3rd level.

Figure 5:
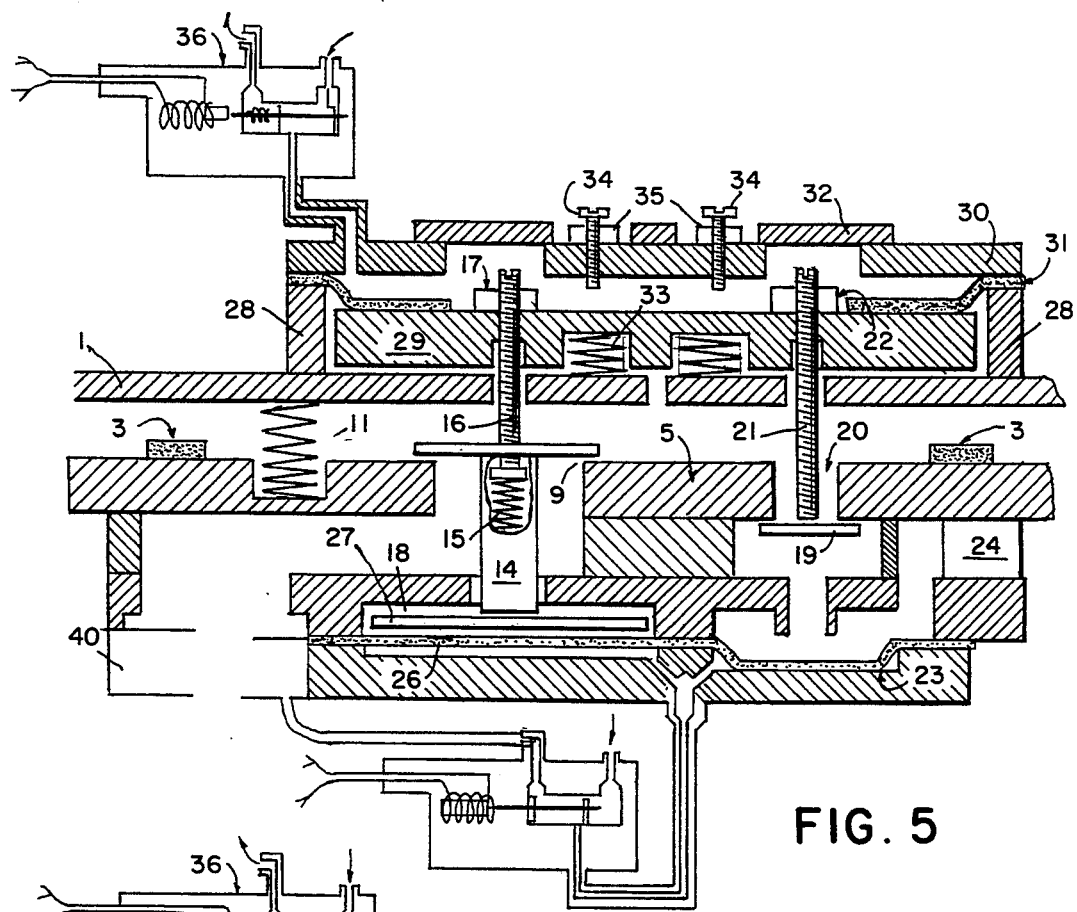
FIG. 5 is a partial sectional view of the device of FIG. 4 in the third or greatest spacing mode of operation.

Referring to FIG. 5: With 1st solenoid valve 25 still energized, but 2nd valve 36 de-energized, atmospheric pressure forces diaphragm 31 and plate 29 downward overcoming springs 33 until plate 29 contacts top plate 1. By thus moving plunger 16 and screw 21 downward relative to the top plate 1 this causes the lower assembly to bring the fixture to 2nd level. De-energizing the 1st solenoid valve 25 overrides any command on the 2nd valve 36 and brings the fixture to the 1st level.

| Logic Table: Solenoid Command | | |
| --- | --- | --- |
| 1st | 2nd | |
| 1 | 1 | 3rd level |
| 1 | 0 | 2nd level |
| 0 | X | 1st level |

The above disclosed invention has a number of particular features which should preferably be employed in combination although each is useful separately without departure from the scope of the invention. While I have shown and described the preferred embodiments of my invention, it will be understood that the invention may be embodied otherwise than as herein specifically illustrated or described, and that certain changes in the form and arrangement of parts and the specific manner of practicing the invention may be made within the underlying idea or principles of the invention within the scope of the appended claims.

I claim:

1. A circuit board test fixture for selectively contacting test points on a circuit board, said fixture comprising:
   a base plate;
   a plurality of first test probes resiliently supported on said base plate and extending orthogonally therefrom;
   a plurality of second test probes resiliently supported on said base plate and extending orthogonally therefrom a greater distance than said first test probes;
   a second plate arranged parallel to said base plate, said base and second plates being movable toward one another;
   resilient perimetral sealing means arranged between said base and second plates thereby providing a vacuum chamber defined by said base plate, said second plate and said sealing means, said vacuum chamber having a variable volume related to spacing of said plates from one another;
   board mounting means on said second plate for sealingly mounting a circuit board to be tested on a surface of said second plate away from said base plate;
   apertures in said second plate arranged for passage of said test probes therethrough and to a circuit board to be tested;
   resilient bias means mounted between said plates for springably biasing said plates away from one another;
   a vacuum source in fluid communication with said vacuum chamber for drawing said plates together against said bias means;
   stop elements arranged between said plates for spacing said plates apart a first fixed distance when a vacuum applied to said vacuum chamber overcomes said resilient bias means, said first fixed distance enabling all said test probes to contact test points on said circuit board in a first test mode;
   vacuum control means interposed between said vacuum source and said vacuum chamber to regulate the amount of vacuum applied to said chamber; and
   adjustable position sensing means sensing the distance between said base and second plates, said position sensing means operatively connected to said vacuum control means in a feedback configuration to controllably supply vacuum to said vacuum chamber to maintain a preset second distance in a second test mode, said second distance enabling only said plurality of second test probes to contact test points on said circuit board while said plurality of first test probes are spaced away from said circuit board, said second distance between said plates being greater than said first distance.

2. The fixture according to claim 1, further comprising atmosphere valve means interposed between said vacuum chamber and ambient atmosphere, said atmosphere valve means being activated in cooperation with said vacuum control means in moving from said first test mode to said second test mode by admitting atmospheric air into said vacuum chamber, said atmosphere valve means being provided with a mechanism which interrupts fluid communication between said ambient atmosphere and said vacuum chamber when said preset second distance is reached.

3. A circuit board test fixture for selectively contacting test points on a circuit board, said fixture comprising:
   a base plate;
   a plurality of n populations of test probes resiliently supported on said base plate and extending upward orthogonally therefrom, all of the probes of a particular population extending upward substantially the same distance, and each population extending upward a different distance than other populations;
   a second plate arranged parallel to said base plate, said base and second plates being movable toward one another;
   resilient perimetral sealing means arranged between said base and second plates thereby providing a vacuum chamber defined by said base plate, said second plate and said sealing means, said vacuum chamber having a variable volume related to spacing of said plates from one another;
   board mounting means on said second plate for sealingly mounting a circuit board to be tested on a surface of said second plate away from said base plate;
   apertures in said second plate arranged for passage of said test probes therethrough and to a circuit board to be tested;
   resilient bias means mounted between said plates for springably biasing said plates away from one another;
   a vacuum source in fluid communication with said vacuum chamber for drawing said plates together against said bias means;
   stop elements arranged between said plates for spacing said plates apart a fixed distance when a vacuum applied to said vacuum chamber completely overcomes said resilient bias means, said fixed distance enabling all said test probes to contact test points on said circuit board in a first test mode;

vacuum control means interposed between said vacuum source and said vacuum chamber to regulate the amount of vacuum applied to said chamber;

adjustable position sensing means sensing the distance between said base and second plates, said position sensing means operatively connected to said vacuum control means in a feedback configuration to controllably supply vacuum to said vacuum chamber to selectively maintain a series of n-1 preset distances between plates in a series of n-1 test modes;

a first member of said series of preset distances enabling all but the shortest population of probes to contact said circuit board in a second test mode, the first preset distance being greater than said fixed distance; and each subsequent member of said series of preset distances being greater than a preceding member of said series of preset distances and spacing away from said circuit board one additional population of test probes in a subsequent test mode in said series of test modes.

4. The fixture according to claim 3, further comprising atmosphere valve means interposed between said vacuum chamber and ambient atmosphere, said atmosphere valve means being activated in cooperation with said vacuum control means in moving between certain test modes by admitting atmospheric air into said vacuum chamber, said atmosphere valve means being provided with a mechanism which interrupts fluid communication between said ambient atmosphere and said vacuum chamber when a preset distance is reached.

* * * * *